(12) United States Patent
Hsieh

(10) Patent No.: US 7,011,926 B2
(45) Date of Patent: Mar. 14, 2006

(54) GAP FORMING PATTERN FRACTURING METHOD FOR FORMING OPTICAL PROXIMITY CORRECTED MASKING LAYER

(75) Inventor: Ren-Guey Hsieh, Pingtung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 467 days.

(21) Appl. No.: 09/975,855

(22) Filed: Oct. 11, 2001

(65) Prior Publication Data

US 2003/0073035 A1    Apr. 17, 2003

(51) Int. Cl.
G03F 9/00 (2006.01)
G03C 5/00 (2006.01)

(52) U.S. Cl. .......................... 430/296; 430/5
(58) Field of Classification Search .............. 430/5, 430/30, 22, 296, 396
See application file for complete search history.

(56) References Cited

U.S. PATENT DOCUMENTS

| 5,241,185 | A | | 8/1993 | Meiri et al. |
| 5,629,772 | A | * | 5/1997 | Ausschnitt |
| 5,667,923 | A | | 9/1997 | Kanata |
| 5,804,339 | A | | 9/1998 | Kim |
| 5,885,748 | A | | 3/1999 | Ohnuma |
| 5,994,009 | A | | 11/1999 | Tzu et al. |
| 6,180,289 | B1 | * | 1/2001 | Hirayanagi |

* cited by examiner

Primary Examiner—Saleha R. Mohamedulla
(74) Attorney, Agent, or Firm—Tung & Asoc.

(57) ABSTRACT

Within a charged particle beam exposure method for forming a patterned resist layer there is employed separating at least one adjacent pair of fractured pattern elements employed in forming a contiguous latent pattern within a blanket resist layer a gap. By employing the gap, a patterned resist layer formed incident to development of the blanket resist layer is formed with enhanced pattern fidelity and enhanced critical dimension control.

13 Claims, 2 Drawing Sheets

GAP FORMING PATTERN FRACTURING METHOD FOR FORMING OPTICAL PROXIMITY CORRECTED MASKING LAYER

BACKGROUND OF THE INVENTION

1. Field of the Invention

The present invention relates generally to lithographic methods employed for fabricating microelectronic fabrications. More particularly, the present invention relates to charged particle beam lithographic methods employed for fabricating microelectronic fabrications.

2. Description of the Related Art

Microelectronic fabrications are formed from microelectronic substrates over which are formed patterned microelectronic conductor layers which are separated by microelectronic dielectric layers. In the process of forming patterned microelectronic conductor layers within microelectronic fabrications, as well as in the process of forming other types of patterned microelectronic layers within microelectronic fabrications, further as well as in the process of forming patterned masking layers within photomasks which may be employed for forming patterned microelectronic layers of various varieties within microelectronic fabrications, there may be employed direct lithographic writing methods, such as but not limited to direct electron beam lithographic writing methods. Such direct lithographic writing methods may be employed to form within a blanket resist layer a latent exposed pattern which upon subsequent development provides a patterned resist mask for: (1) etching within a microelectronic fabrication a blanket microelectronic layer formed beneath the patterned resist mask to form a patterned microelectronic layer formed beneath the patterned resist mask; or in the alternative (2) etching within a photomask a blanket masking layer formed beneath the patterned resist mask to form a patterned masking layer formed beneath the patterned resist mask.

While direct lithographic writing methods, such as in particular direct electron beam lithographic writing methods, are thus desirable within the art of microelectronic fabrication for forming patterned resist layers which are employed either directly or indirectly for forming patterned microelectronic layers within microelectronic fabrications, direct lithographic writing methods, and in particular direct electron beam lithographic writing methods, are nonetheless not entirely without problems in the art of microelectronic fabrication for forming patterned resist layers which are employed either directly or indirectly for forming patterned microelectronic layers within microelectronic fabrications.

In that regard, it is known in the art of microelectronic fabrication that, in particular, electron beam exposed directly written and subsequently developed patterned resist layers are often difficult to form with enhanced pattern fidelity and enhanced critical dimension uniformity encompassing various areal densities of patterned resist layers within microelectronic fabrications insofar as, in particular, electron beam radiation when employed for directly forming patterned resist layers within microelectronic fabrications scatters from either within a blanket resist layer which is directly exposed while employing electron beam radiation (i.e., forward scattering), or in the alternative electron beam radiation also scatters from a substrate over which is formed a blanket resist layer which is directly exposed employing electron beam radiation (i.e., back scattering). Such forward scattering or back scattering leads to pattern density related in homogeneity effects, such as pattern fidelity in homogeneity effects and critical dimension uniformity in homogeneity effects, such in homogeneity effects generally known in the art of microelectronic fabrication as proximity effects.

It is thus desirable in the art of microelectronic fabrication to provide methods and materials through which there may be attenuated proximity effects when exposing a blanket resist layer while employing a charged particle beam method, and in particular an electron beam method, in the process of forming from the blanket resist layer a patterned resist layer, such that a patterned microelectronic layer formed while employing the patterned resist layer as an etch mask may similarly also be formed with enhanced pattern fidelity and enhanced critical dimension uniformity.

It is towards the foregoing objects that the present invention is directed.

Various methods have been disclosed in the art of microelectronic fabrication for forming, with desirable properties, patterned resist layers for use when fabricating microelectronic fabrications.

Included among the methods, but not limiting among the methods, are methods disclosed within: (1) Meiri et al., in U.S. Pat. No. 5,241,185 (an electron beam exposure method which employs a determination of an electron beam radiation dose with respect to a contracted electron beam exposed resist layer pattern having a negative bias with respect to desired developed resist layer pattern); (2) Kanata, in U.S. Pat. No. 5,667,923 (a charged particle beam exposure method which employs a determination of a backscattered charged particle beam density from a patterned substrate layer over which is formed a blanket resist layer which is desired to be exposed while employing the charged particle beam exposure method); (3) Kim, in U.S. Pat. No. 5,804,339 (an electron beam radiation exposure method which employs a separate electron beam exposure for purposes of correcting for an optical proximity effect); (4) Ohnuma, in U.S. Pat. No. 5,885,748 (an electron beam exposure method which employs corrections for both self proximity effects and mutual proximity effects when exposing a blanket resist layer while employing the electron beam exposure method); and (5) Tzu et al., in U.S. Pat. No. 5,994,009 (an electron beam exposure method which provides for correction of both optical proximity effects and process related proximity effects, such as topographic process related proximity effects, when exposing a blanket resist layer while employing the electron beam exposure method).

Desirable within the art of microelectronic fabrication are additional methods and materials through which there may be attenuated proximity effects when exposing a blanket resist layer while employing a charged particle beam method, and in particular an electron beam method, in the process of forming from the blanket resist layer a patterned resist layer, such that a patterned microelectronic layer formed while employing the patterned resist layer as an etch mask may similarly also be formed with enhanced pattern fidelity and enhanced critical dimension uniformity.

It is towards the foregoing objects that the present invention is directed.

SUMMARY OF THE INVENTION

A first object of the present invention is to provide a charged particle beam method for exposing a blanket resist layer.

A second object of the present invention is to provide a charged particle beam method in accord with the first object of the present invention wherein there is attenuated a proximity effect when exposing the blanket resist layer while employing the charged particle beam method.

A third object of the present invention is to provide a method in accord with the first object of the invention and the second object of the invention, wherein the method is readily commercially implemented.

In accord with the objects of the present invention, there is provided by the present invention a method for forming a patterned resist layer. To practice the method of the present invention, there is first provided a substrate. There is then formed over the substrate a blanket resist layer. There is then exposed, while employing a charged particle beam method susceptible to a proximity effect, the blanket resist layer to form a charged particle beam exposed blanket resist layer having formed therein a contiguous latent pattern. Within the present invention, the charged particle beam method employs when forming the contiguous latent pattern a series of adjacent fractured pattern elements, further wherein at least one adjacent pair of fractured pattern elements is separated by a gap. Finally, there is then developed the charged particle beam exposed blanket resist layer to form a patterned resist layer.

The present invention is particularly useful when fabricating a photomask while employing the method of the present invention.

The present invention provides a charged particle beam method for exposing a blanket resist layer, where there is attenuated a proximity effect when exposing the blanket resist layer while employing the charged particle beam method. The present invention realizes the foregoing object by employing when exposing a blanket resist layer while employing a charged particle beam method to form therein a contiguous latent pattern derived from a series of adjacent fractured pattern elements at least one gap separating at least one adjacent pair of the adjacent fractured pattern elements.

The present invention is readily commercially implemented. The present invention employs methods and materials as are generally known in the art of microelectronic fabrication, but employed within the context of particular design limitations and particular process limitations which provide at least in part the present invention. Since it is at least in part particular design limitations and particular process limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a charged particle beam method for exposing a blanket resist layer, where there is attenuated a proximity effect (such as a coulomb effect) when exposing the blanket resist layer while employing the charged particle beam method (such as an electron beam charged particle beam method).

The present invention realizes the foregoing object by employing when exposing a blanket resist layer while employing a charged particle beam method to form therein a contiguous latent pattern derived from a series of adjacent fractured pattern elements at least one gap separating at least one adjacent pair of the series of adjacent fractured pattern elements.

The preferred embodiment of the present invention illustrates the present invention most particularly within the context of forming, with enhanced pattern fidelity and with enhanced critical dimension uniformity, a patterned photoresist layer which is employed as a patterned etch mask layer for forming a patterned masking layer from a blanket masking layer within a microelectronic fabrication mask (i.e., a photomask). However, the present invention may analogously also be employed for ultimately forming from other blanket target layers including but not limited to blanket conductor target layers, blanket semiconductor target layers and blanket dielectric target layers, while employing a direct writing charged particle beam lithographic method which is susceptible to a proximity effect, a corresponding patterned target layer with an enhanced pattern fidelity and enhanced critical dimension uniformity. Similarly, the present invention may be employed in forming such other patterned target layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

As is understood by a person skilled in the art, the present invention provides particular value within the context of vector scan pattern element fracturing (in comparison with raster scan pattern element fracturing), within electron beam lithographic methods. In that regard, the present invention is valuable insofar as it may often contribute to avoidance of particularly thin fractured pattern element slivers which compromise pattern fidelity and critical dimension uniformity when forming patterned resist layers within microelectronic fabrications.

Referring now to FIG. 1 to FIG. 4, there is shown a series of schematic cross-sectional diagrams illustrating the results of progressive stages in forming a microelectronic fabrication mask which may be fabricated in accord with the present invention.

Figure 1:
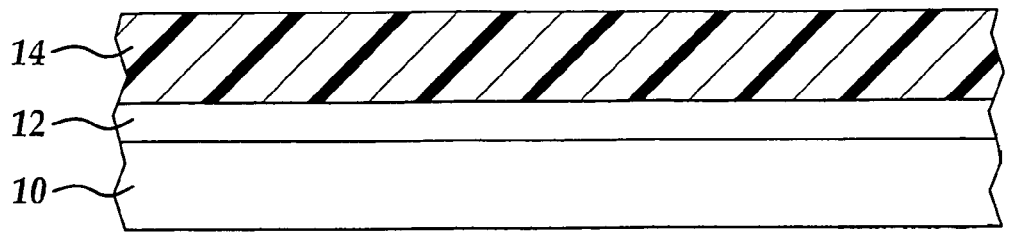
FIG. 1, FIG. 2, FIG. 3 and FIG. 4 show a series of schematic cross-sectional diagrams illustrating the results of progressive stages in forming a microelectronic fabrication mask which may be fabricated in accord with the present invention.

Shown in FIG. 1 is a schematic cross-sectional diagram of the microelectronic fabrication mask at an early stage in its fabrication in accord with the preferred embodiment of the present invention.

Shown in FIG. 1 is a transparent substrate 10 having formed thereupon a blanket masking layer 12 in turn having formed thereupon a blanket resist layer 14.

Within the preferred embodiment of the present invention with respect to the transparent substrate 10, and although transparent substrates are known in the art of microelectronic mask fabrication employing transparent materials including but limited to transparent glass materials and transparent quartz materials, for the preferred embodiment of the present invention, the transparent substrate 10 is typically and preferably formed of a transparent quartz material formed to a conventional thickness.

Similarly, within the preferred embodiment of the present invention with respect to the blanket masking layer 12, and although it is known in the art of microelectronic mask fabrication to provide blanket masking layers of masking materials including but not limited to conductor masking materials and dielectric masking materials, for the preferred embodiment of the present invention, the blanket masking layer 12 is typically and preferably formed of a conductor masking material, and more preferably a chromium conductor masking material, formed to a thickness of from about 4000 to about 10000 angstroms upon the transparent substrate 10.

Finally, within the preferred embodiment of the present invention with respect to the blanket resist layer 14, and although it is known in the art of microelectronic mask fabrication that resist layers may be formed of resist materials including but not limited to positive resist materials and negative resist materials (either of which is applicable within the present invention), for the preferred embodiment of the present invention, the blanket resist layer 14 is typically and preferably formed from a conventional resist material, formed to a thickness of from about 4000 to about 10000 angstroms upon the blanket masking layer 12.

Figure 2:
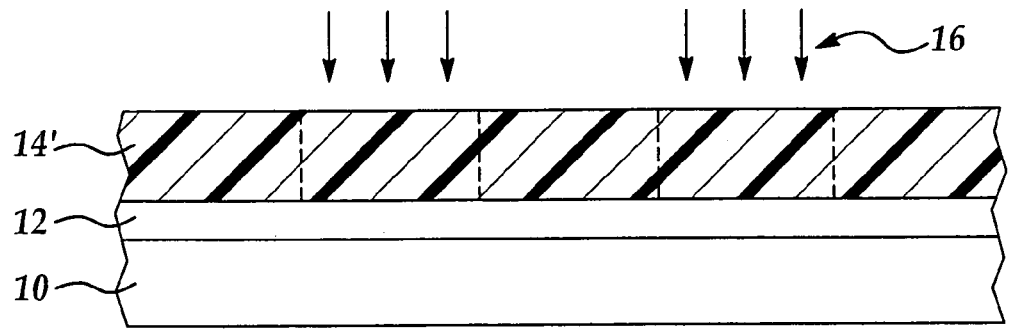

Referring now to FIG. 2, there is shown a schematic cross-sectional diagram illustrating the results of further processing of the microelectronic fabrication mask whose schematic cross-sectional diagram is illustrated in FIG. 1.

Shown in FIG. 2 is a schematic cross-sectional diagram of a microelectronic fabrication mask otherwise equivalent to the microelectronic fabrication mask whose schematic cross-sectional diagram is illustrated in FIG. 1, but wherein the blanket resist layer 14 has been exposed while employing an electron beam 16 to form an electron beam exposed blanket resist layer 14'.

Within the preferred embodiment of the present invention with respect to the electron beam 16, the electron beam 16 is typically and preferably of a variety which may be shaped when exposing the blanket resist layer 14 with the electron beam 16 when forming therefrom the electron beam exposed blanket resist layer 14'. In accord with the foregoing limitation, and as indicated above, the present invention provides particular value within the context of electron beam vector scanning methods for electron beam exposing blanket resist layers, but other electron beam scanning methods, such as but not limited to raster scanning methods, are not inherently precluded within the context of the present invention.

As is understood by a person skilled in the art, although the preferred embodiment of the present invention illustrates the invention within the context of exposing the blanket resist layer 14 with the electron beam 16 to form the electron beam exposed blanket resist layer 14', the present invention also provides value within the context of other charged particle beam methods, such as but limited to ion beam methods, for exposing blanket resist layers to form charged particle beam exposed blanket resist layers.

Figure 3:
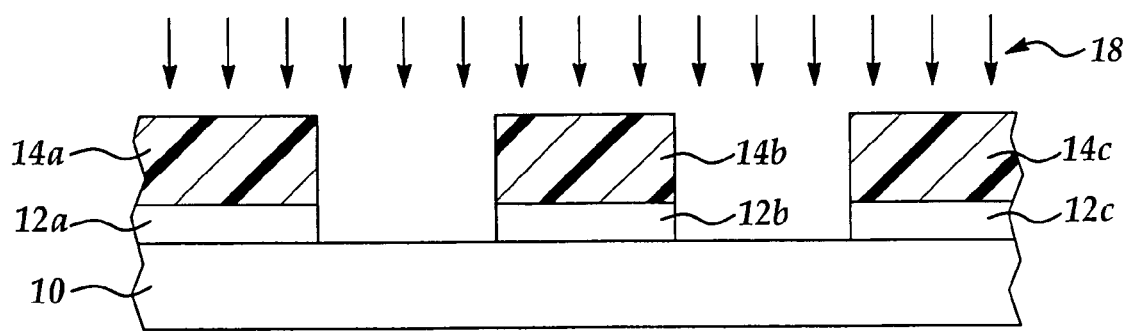

Referring now to FIG. 3, there is shown a schematic cross-sectional diagram illustrating the results of further processing of the microelectronic fabrication mask whose schematic cross-sectional diagram is illustrated in FIG. 2.

Shown in FIG. 3 is a schematic cross-sectional diagram of a microelectronic fabrication mask otherwise equivalent to the microelectronic fabrication mask whose schematic cross-sectional diagram is illustrated in FIG. 2, but wherein, in a first instance, the electron beam exposed blanket resist layer 14' has been developed to form a series of patterned resist layers 14a, 14b and 14c.

Within the preferred embodiment of the present invention, the electron beam exposed blanket resist layer 14' as illustrated within the schematic cross-sectional diagram of FIG. 2 may be developed to form the series of patterned resist layers 14a, 14b and 14c as illustrated within the schematic cross-sectional diagram of FIG. 3 while employing resist developer methods and materials as are appropriate to the resist material from which is formed the electron beam exposed blanket resist layer 14'.

Figure 4:
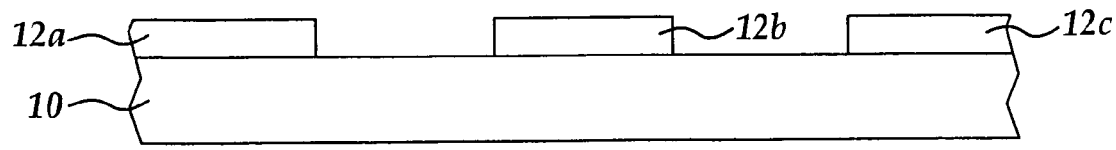

Shown also within the schematic cross-sectional diagram of FIG. 4 is the results of patterning the blanket masking layer 12 to form a series of patterned masking layers 12a, 12b and 12c, while employing the series of patterned resist layers 14a, 14b and 14c as an etch mask, in conjunction with an etchant 18.

Within the preferred embodiment of the present invention, the etchant 18 is provided employing methods and materials appropriate to the material from which is formed the blanket masking layer 12.

Referring now to FIG. 4, there is shown a schematic cross-sectional diagram illustrating the results of further processing of the microelectronic fabrication mask whose schematic cross-sectional diagram is illustrated in FIG. 3.

Shown in FIG. 4 is a schematic cross-sectional diagram of a microelectronic fabrication mask otherwise equivalent to the microelectronic fabrication mask whose schematic cross-sectional diagram is illustrated in FIG. 3, but wherein the series of patterned resist layers 14a, 14b and 14c has been stripped from the series of patterned masking layers 12a, 12b and 12c.

Within the preferred embodiment of the present invention, the series of patterned resist layers 14a, 14b and 14c may be stripped from the series of patterned masking layers 12a, 12b and 12c as illustrated within the microelectronic fabrication mask whose schematic cross-sectional diagram is illustrated in FIG. 3 to provide in part the microelectronic fabrication mask whose schematic cross-sectional diagram is illustrated in FIG. 4 while employing resist stripping methods and materials as are conventional in the art of microelectronic fabrication mask fabrication.

As is understood by a person skilled in the art, and as will become clearer within the context of some schematic plan view diagrams which follow, it is the nature of the electron beam 16 exposure of the blanket resist layer 14 as illustrated within the schematic cross-sectional diagram of FIG. 1 to provide the electron beam exposed blanket resist layer 14' as illustrated in the schematic cross-sectional diagram of FIG. 2 that provides at least in part the present invention.

Figure 5A:
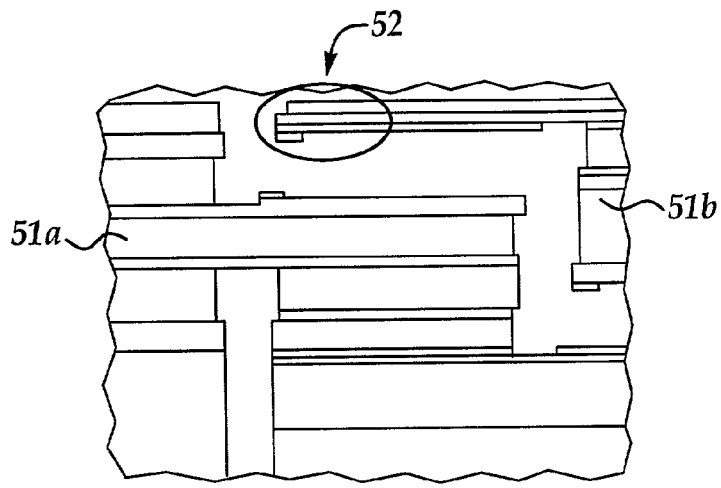
FIG. 5a and FIG. 5b show a pair of schematic plan view diagrams illustrating electron beam pattern element fracturing when forming an electron beam exposed blanket resist layer conventional in the art of microelectronic fabrication.
Figure 5B:
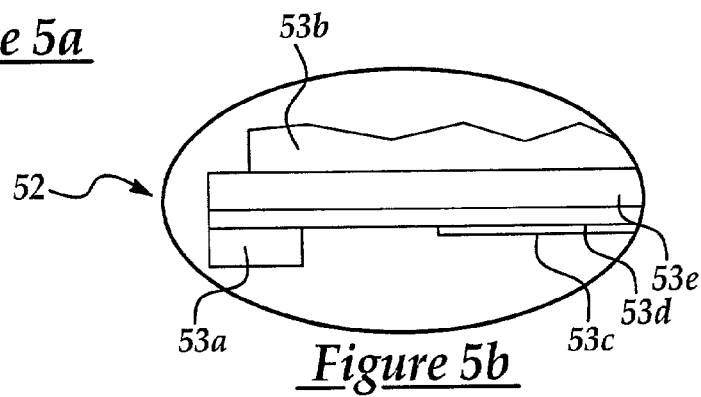

Referring now to FIG. 5a and FIG. 5b, there is shown a pair of schematic plan view diagrams illustrating in greater detail electron beam pattern element fracturing (for purposes of defining locations and sizes of rectangular electron beam shots) when forming an electron beam exposed blanket photoresist layer generally conventional in the art of microelectronic fabrication.

Shown in FIG. 5a is a schematic plan view diagram of an electron beam pattern element fracture pattern which comprises a pair of electron beam exposed contiguous regions 51a and 51b which serve as pattern elements. As is shown within the schematic plan view diagram of FIG. 5a, and in particular with greater detail within the schematic plan view diagram of FIG. 5b which is directed towards exploded region 52 of the electron beam exposed contiguous region 51b, is a series adjacent and adjoining fractured pattern elements 53a, 53b, 53c, 53d and 53e from which is comprised the electron beam exposed contiguous region 51b.

Figure 6A:
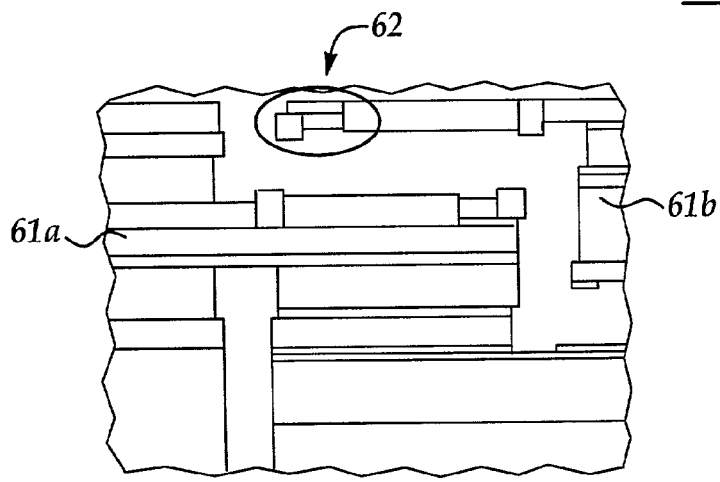
FIG. 6a and FIG. 6b show a pair of schematic plan view diagrams illustrating electron beam pattern element fracturing when forming an electron beam exposed blanket resist layer in accord with the present invention.
Figure 6B:
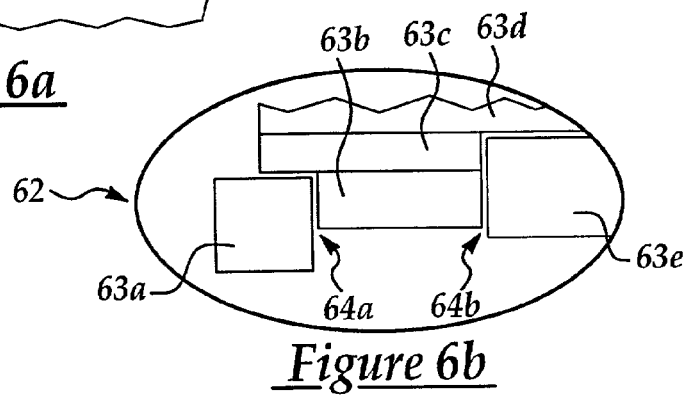

Referring now to FIG. 6a and FIG. 6b, there is shown a pair of schematic plan view diagrams illustrating in greater detail pattern element fracturing with respect to an electron beam exposed blanket photoresist layer in accord with a preferred embodiment of the present invention.

Shown in FIG. 6a in general is a pattern element fracture map pattern otherwise generally equivalent with the pattern element fracture map pattern of FIG. 5a, wherein there is shown a pair of electron beam exposed contiguous regions 61a and 61b. There is finally also illustrated within the schematic plan view diagram of FIG. 6a an exploded region 62 whose schematic plan view diagram is illustrated in greater detail within FIG. 6b.

As is illustrated within the schematic plan view diagram of FIG. 6b, there is also shown a series of adjacent fractured pattern elements 63a, 63b, 63c, 63d and 63e which comprise in part the electron beam exposed contiguous region 61b, but wherein at least one pair (and preferably more than one pair) of the fractured pattern elements is separated by a gap 64a or 64b, rather than being adjoining. As is illustrated within the schematic plan view diagram of FIG. 6b, both of the gaps 64a and 64b have horizontal and vertical components.

Within the present invention and the preferred embodiment of the present invention with respect to the pair of gaps 64a and 64b, each of the pair of gaps 64a and 64b typically and preferably has a gap width of less than about 20 nanometers, and more preferably from about 10 to about 20 nanometers, while also having a gap length of greater than about 100 nanometers, and more preferably from about 100 to about 1000 nanometers. Thus, typically and preferably, each of the pair of gaps 64a and 64b is not itself generally optically resolvable. Typically and preferably, the gaps 64a and 64b may be formed employing generally conventional pattern fracturing algorithms, which are typically employed in a single direction, but within the context of the present invention employed in two directions. As an alternative, the gaps 64a and 64b may be formed with an adjunct pattern fracturing in a direction perpendicular to a conventional data fracturing.

As is further understood by a person skilled in the art, upon development of an electron beam exposed blanket resist layer formed in accord with the pattern element fracture map of FIG. 6a in comparison with an electron beam exposed blanket resist layer formed in accord with the pattern element fracture map of FIG. 5a, there is provided an enhanced pattern fidelity and critical dimension uniformity of a pair of patterned photoresist layers.

While not wishing to be bound to any particular theory of operation of the present invention, it is believed that providing the gap, or a series of gaps, there is provided for an attenuated proximity effect within sides and corners of electron beam fractured pattern elements where proximity effects might otherwise be most pronounced. Similarly, by providing the gap, or a series of gaps, there may also be avoided within an electron beam pattern fracture map particularly thin fracture elements which typically inherently have enhanced proximity effects.

EXAMPLE

There was provided two photomask blanks each formed of a transparent quartz substrate of thickness about 0.76 centimeters, in turn having formed thereupon a blanket chromium layer of thickness about 700 angstroms. In turn, each of the blanket chromium layers had formed thereupon a blanket photoresist layer formed of a conventional electron beam photosensitive photoresist material formed to a thickness of about 4000 angstroms.

One of each of the two photomask blanks was then electron beam photoexposed in accord with either: (1) the electron beam pattern fracture map whose schematic plan view diagram is illustrated in FIG. 5a and FIG. 5b; or (2) the electron beam pattern fracture map whose schematic plan view diagram is illustrated in FIG. 6a and FIG. 6b. Within the photomask blank which was electron beam exposed in accord with the pattern fracture map whose schematic plan view diagram is illustrated in FIG. 6a and FIG. 6b, there was employed a series of gaps of linewidth about 12.5 nanometers and length about 200 nanometers.

There was then developed the pair of electron beam exposed blanket photoresist layers upon the pair of photomask blanks to provide a pair of patterned photoresist layers upon the pair of photomask blanks. There was then measured the pattern fidelity and critical dimension uniformity of the patterns within the pair of patterned photoresist layers. The measurements were undertaken, while employing methods as are otherwise generally conventional in the art of photomask fabrication.

There was observed for the patterned photoresist layer formed employing the pattern fracture map incorporating the gaps improved feature definition (i.e., pattern fidelity) with respect to serifs and edges, as well as improved critical dimension uniformity (by an improvement factor of about 60 nanometers).

As is understood by a person skilled in the art, the preferred embodiment of the present invention is illustrative of the present invention rather than limiting of the present invention. Revisions and modifications may be made to methods, materials, structures and dimensions through which may be fabricated a photomask, or in the alternative a microelectronic fabrication, in accord with the preferred embodiment of the present invention while still fabricating a photomask, or in the alternative a microelectronic fabrication, in accord with the present invention, further in accord with the accompanying claims.

What is claimed is:

1. A method for forming a patterned resist layer comprising:
    providing a substrate;
    forming a resist layer over the substrate;
    employing a direct write charged particle beam method to expose the resist layer to form a contiguous latent pattern within the exposed resist layer, wherein the contiguous latent pattern comprises a series of adjacent direct write fractured pattern elements and at least one adjacent pair of the series of adjacent direct write fractured pattern elements is separated by a gap; and
    developing the exposed resist layer to form a patterned resist layer.

2. The method of claim 1 wherein the charged particle beam method is selected from the group consisting of electron beam methods and ion beam methods.

3. The method of claim 1 wherein the resist layer is formed of a positive resist material.

4. The method of claim 1 wherein the resist layer is formed of a negative resist material.

5. The method of claim 1 wherein the gap has a width of from about 10 to about 20 nanometers.

6. The method of claim 1 wherein the gap has a length of from about 100 to about 1000 microns.

7. The method of claim 1 further comprising:
   forming a masking layer over the substrate a blanket target layer prior to forming the resist layer; and
   employing the patterned resist layer as a mask to pattern the masking layer.

8. The method of claim 7 wherein the masking layer selected from the group consisting of microelectronic conductor materials, microelectronic semiconductor materials and microelectronic dielectric materials.

9. A method for forming a photomask comprising:
   providing a transparent substrate;
   forming a masking layer over the transparent substrate;
   forming a resist layer over the masking layer;
   employing a direct write charged particle beam method to expose the resist layer to form a contiguous latent pattern within the exposed resist layer, wherein the contiguous latent pattern comprises a series of adjacent direct write fractured pattern elements and at least one adjacent pair of the series of adjacent direct write fractured pattern elements is separated by a gap, and the gap has a gap width of from about 10 to about 20 nanometers;
   developing the exposed resist layer to form a patterned resist layer; and
   employing the patterned resist layer as a mask layer to pattern the masking layer.

10. The method of claim 9 wherein the charged particle beam method is selected from the group consisting of electron beam methods and ion beam methods.

11. The method of claim 9 wherein the resist layer is formed of a positive resist material.

12. The method of claim 9 wherein the resist layer is formed of a negative resist material.

13. The method of claim 9 wherein the gap has a length of from about 100 to about 1000 nanometers.

* * * * *